United States Patent
Kakoschke et al.

(10) Patent No.: US 7,291,881 B2
(45) Date of Patent: Nov. 6, 2007

(54) BIT LINE STRUCTURE AND METHOD OF FABRICATION

(75) Inventors: Ronald Kakoschke, München (DE); Danny Shum, Poughkeepsie, NY (US); Georg Tempel, Dresden (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/592,844

(22) Filed: Nov. 2, 2006

(65) Prior Publication Data
US 2007/0049050 A1 Mar. 1, 2007

Related U.S. Application Data

(62) Division of application No. 10/513,163, filed as application No. PCT/DE03/02676 on Aug. 8, 2003, now Pat. No. 7,176,088.

(30) Foreign Application Priority Data

Sep. 2, 2002 (DE) .............................. 102 40 436

(51) Int. Cl.
*H01L 29/76* (2006.01)
(52) U.S. Cl. ............... 257/314; 257/316; 257/E27.103; 438/262
(58) Field of Classification Search ................ 257/314, 257/316, E27.103; 438/262
See application file for complete search history.

(56) References Cited

U.S. PATENT DOCUMENTS

| | | | |
|---|---|---|---|
| 5,430,673 A * | 7/1995 | Hong et al. .................. 365/182 |
| 5,796,167 A | 8/1998 | Koga .......................... 257/758 |
| 6,008,522 A | 12/1999 | Hong et al. .................. 257/390 |
| 6,153,471 A * | 11/2000 | Lee et al. .................... 438/263 |
| 6,348,374 B1 * | 2/2002 | Athavale et al. ............. 438/243 |
| 6,734,482 B1 * | 5/2004 | Tran et al. .................. 257/296 |
| 6,787,843 B2 | 9/2004 | Tempel ........................ 257/315 |
| 2003/0007386 A1 * | 1/2003 | Georgakos et al. ..... 365/185.17 |
| 2003/0230783 A1 * | 12/2003 | Willer et al. ................. 257/390 |

FOREIGN PATENT DOCUMENTS

| DE | 10062245 A1 | 12/2000 |
|---|---|---|
| WO | WO 01/99152 A2 | 12/2001 |

OTHER PUBLICATIONS

PCT International Search Report PCT/DE 03/02676.

* cited by examiner

*Primary Examiner*—Trung Dang
(74) *Attorney, Agent, or Firm*—James L. Katz; Brinks Hofer Gilson & Lione

(57) ABSTRACT

The invention relates to a bit line structure having a surface bit line (DLx) and a buried bit line (SLx), the buried bit line (SLx) being formed in a trench with a trench insulation layer (6) and being connected to doping regions (10) with which contact is to be made via a covering connecting layer (12) and a self-aligning terminal layer (13) in an upper partial region of the trench.

28 Claims, 9 Drawing Sheets

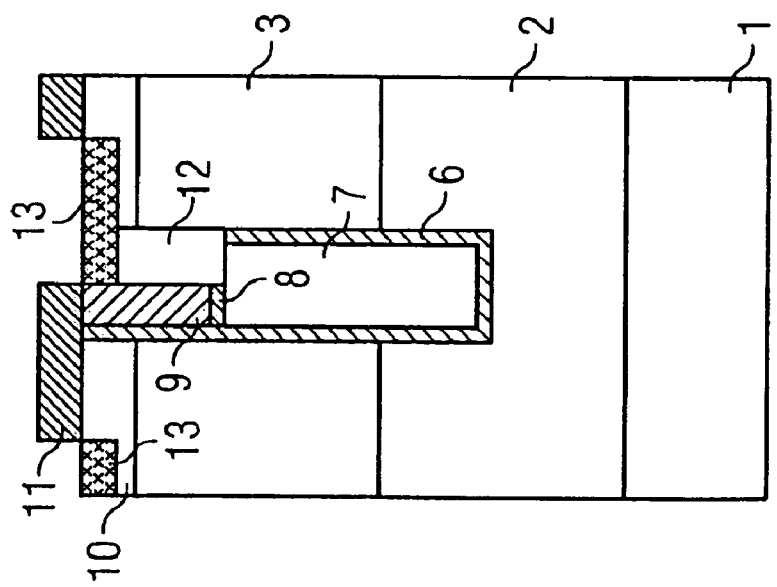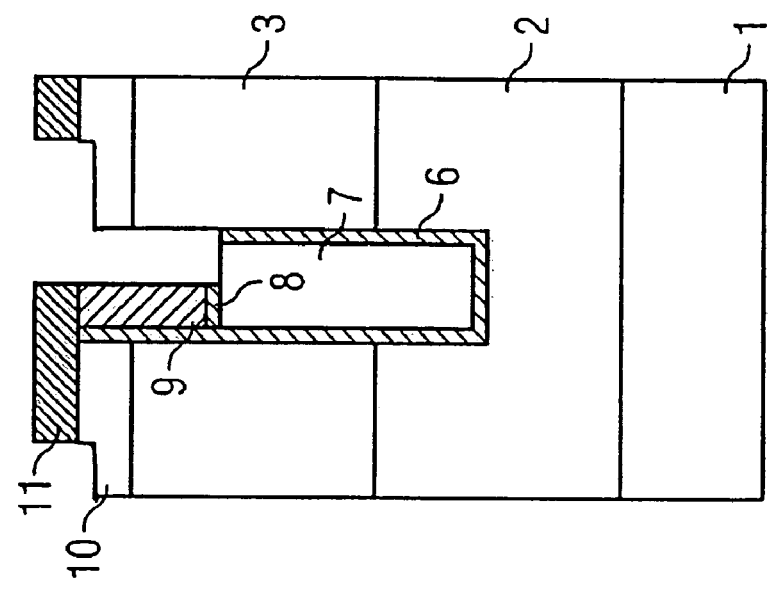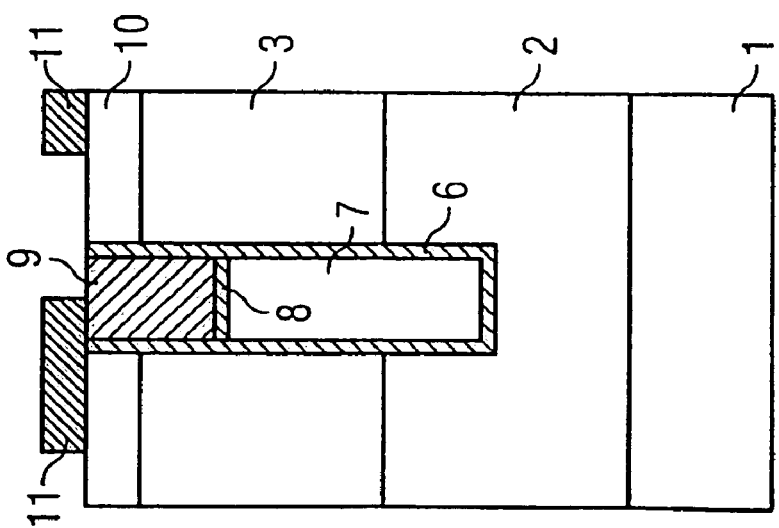

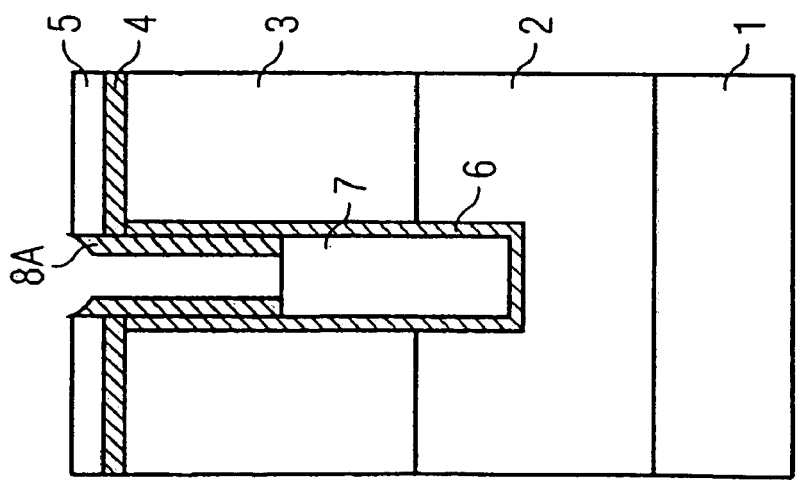
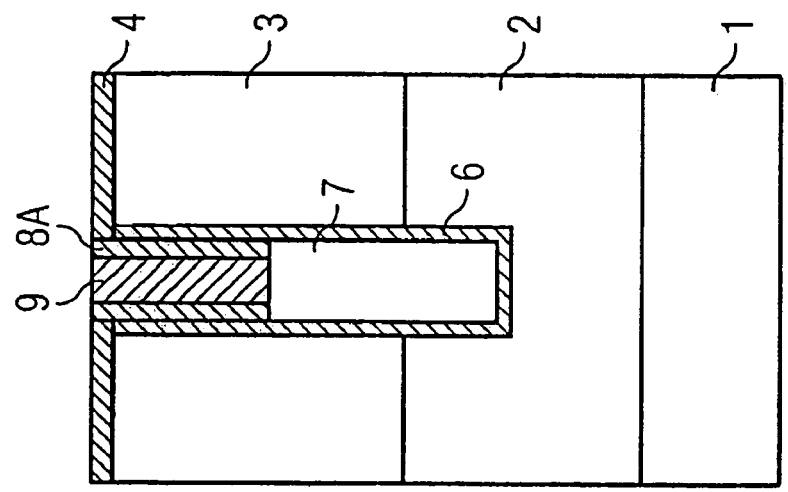
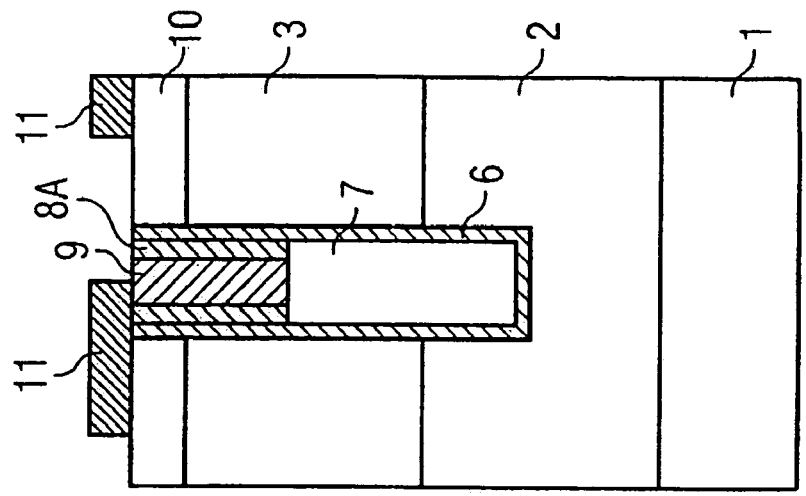

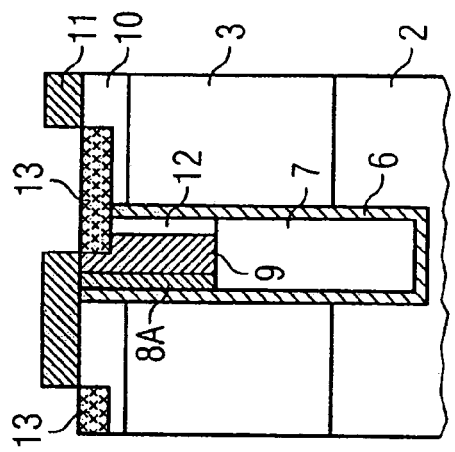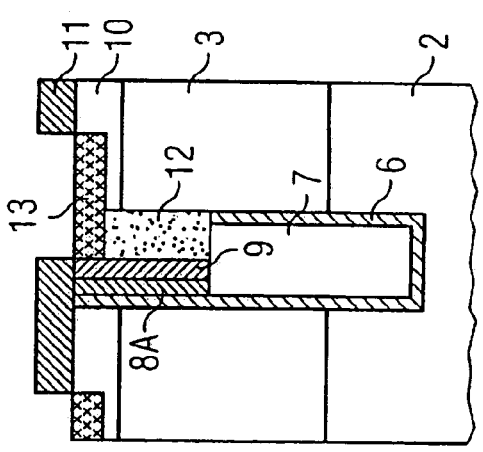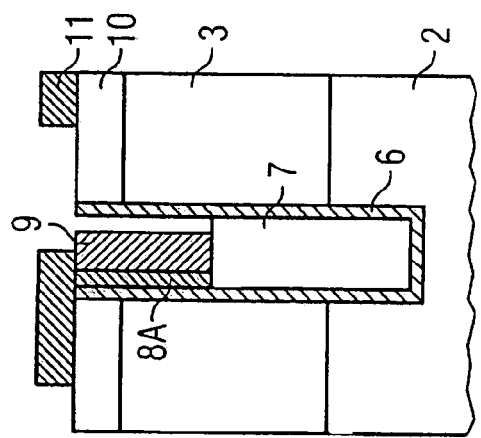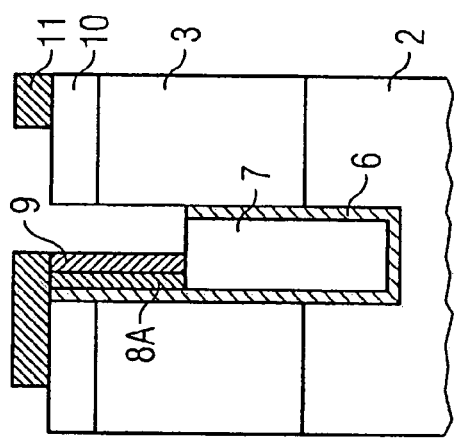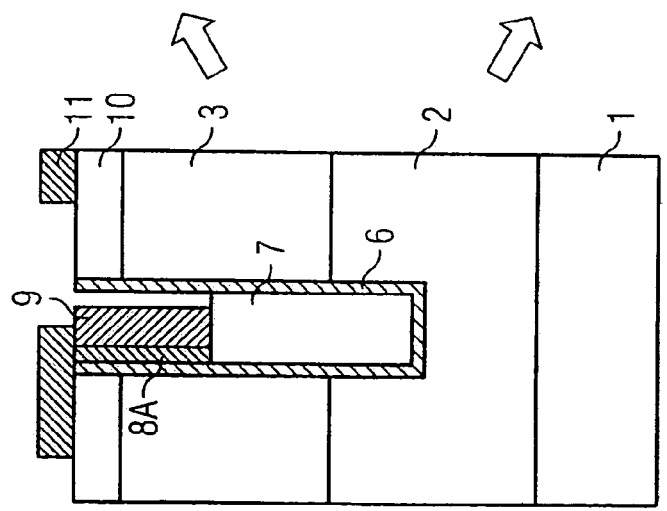

BIT LINE STRUCTURE AND METHOD OF FABRICATION

REFERENCE TO RELATED APPLICATIONS

This application is a divisional under 37 C.F.R. § 1.53(b) of U.S. patent application Ser. No. 10/513,163 filed Jul. 22, 2005 now U.S. Pat. No. 7,176,088, the entire disclosure of which is hereby incorporated by reference.

U.S. patent application Ser. No. 10/513,163 is related to and claims the benefit of priority under 35 U.S.C. §§ 120, 271 and 365 to Patent Cooperation Treaty patent application No. PCT/DE2003/002676, filed on Aug. 8, 2003, which was published at WO 2004/023,553, in German.

U.S. patent application Ser. No. 10/513,163 is further related to and claims benefit of priority under 35 U.S.C. § 19 to the filing date of Sep. 2, 2002 of German patent application No. 10240436.4 DE, filed on Sep. 2, 2002.

FIELD OF THE INVENTION

The present invention relates to a bit line structure and to a method of fabrication thereof, and in particular to a sub-100 nm bit line structure and an associated fabrication method that can be used in a nonvolatile Selective NOR ("SNOR") memory circuit for in each case selectively driving source and drain lines.

BACKGROUND

When realizing memory circuits, a basic distinction is drawn on the basis of the storage architecture; the most common representatives are referred to as the NAND and NOR architectures. In both architectures, one-transistor memory cells are arranged in matrix form and are driven via signal connections referred to as word and bit lines.

Whereas in NAND architectures a multiplicity of switching elements or storage elements are connected in series with one another and are driven via a common selection gate or a selection transistor, the respective switching elements in NOR architectures are organized in parallel or in matrix form, as a result of which each switching element can be selected individually.

FIG. 1 shows a simplified illustration of a so-called SNOR architecture (selective NOR), in which, in contrast to the NOR architecture with "common source" structure, the individual switching elements SE1, SE2, . . . are driven selectively via a respective source line SL1, SL2, . . . and via a respective drain line DL1, DL2, . . . This selective driving is carried out for example by means of respective bit line controllers BLC which, as it were, realize the common bit lines BL1, BL2, . . . Further shrinks or more extensive integration of semiconductor circuit arrangements can be carried out in this way, since the SNOR architecture does not rely on a predetermined minimum cell transistor length or channel length.

FIG. 2 shows a simplified illustration of a conventional layout of the SNOR architecture in accordance with FIG. 1. In accordance with FIG. 2, the switching elements or memory elements SE1, SE2, . . . are formed in active areas AA of a semiconductor substrate which have a substantially straight strip-type structure. On the multiplicity of strip-type active areas AA arranged in columns there overlie, in rows, layer stacks or word line stacks WL1, WL2, . . . likewise formed in strip form. Each crossover point or overlap region between such a strip-type active area AA and a word line stack WL1 to WL3 formed in strip form thus represents a multiplicity of switching elements or memory elements SE.

Contacts are necessary for making contact with respective drain regions D and source regions S, which contacts are usually formed in the active areas AA, but may often also extend into an adjoining isolation region STI (Shallow Trench Isolation). In a further layer lying above that, which preferably represents a first metallization layer, there are then situated the source lines SL1, SL2, . . . and also the drain lines DL1, DL2, . . . for the respective bit lines BL. In this case, the drain lines are connected to the associated drain regions D of the active area AA via corresponding contacts K, the source lines being connected to the associated source regions S via corresponding contacts in the same way.

What is disadvantageous, however, in the case of such a conventional bit line structure is that a more than twice as intensive metallization is present on account of the additional source lines in comparison with a common source architecture, which represents a limiting factor for more extensive integration or further shrinks.

Therefore, to improve an integration density, it is proposed, in accordance with document DE 100 62 245 A1, to form the source lines and drain lines as spacers at an insulating web and to allow contact to be made with the associated source regions and drain regions via an additional insulation layer with suitable openings. Furthermore, however, the space required on account of the source lines and drain lines formed at the substrate surface and lying parallel is relatively large and prevents more intensive integration.

Furthermore, document U.S. Pat. No. 6,008,522 has disclosed a buried bit line which is formed in an insulation trench and in each case makes symmetrical contact with source regions and drain regions via a terminal layer.

Accordingly, a bit line structure and an associated fabrication method is needed, which, in particular with SNOR architectures, allows further integration to be realized with a reduced need for space.

SUMMARY

The present invention is defined by the following claims, and nothing in this section should be taken as a limitation on those claims. By way of introduction, the preferred embodiments described below relate to a bit line structure for realizing SNOR architectures with a significantly reduced need for space is obtained in particular by the use of a surface bit line, which is formed above a substrate surface for connection of a multiplicity of first doping regions, and a buried bit line, which for connection of a multiplicity of second doping regions is formed inside a substrate, in such a manner that a trench in the substrate, a trench insulation layer at a trench surface of the trench, the buried bit line in a lower region of the trench, a covering insulation layer in a first upper partial region of the trench, a multiplicity of covering connecting layers in a second upper partial region of the trench, and a multiplicity of self-aligning terminal layers in the region of the substrate surface are formed, the multiplicity of covering connecting layers being electrically connected via the terminal layers to the multiplicity of second doping regions.

The substrate used is preferably a silicon semiconductor wafer, the covering connecting layer used is preferably highly doped polysilicon and the self-aligning terminal layer is preferably a silicide, with the result that the buried bit line with the associated doping regions can be connected in a particularly simple way and with minimal feature sizes.

Particularly in the case of direct contact between the multiplicity of connecting layers and the substrate, improved substrate contact-making or well-contact making, if wells are formed therein, is obtained, with the result that, for example, more homogenous tunneling, improved endurance with regard to the number of write/erase cycles and a reduction in parasitic diodes can be achieved. Furthermore, in particular in the case of a multiple well structure in the substrate, it is thereby possible to eliminate complex-surface well contacts, with the result that the demand for space is further reduced.

It is preferable for drain regions to be formed as first doping regions and source regions to be formed as second doping regions in a nonvolatile SNOR semiconductor memory circuit, in which case associated word line stacks have a first insulation layer, a charge-storing layer, a second insulation layer and a control layer. In this way, it is possible to realize particularly area-optimized nonvolatile semiconductor memories, such as for example flash EPROMs, E2PROMs and 5 the like.

The preferred embodiments further relate to a method for fabricating a bit line structure. In one embodiment, the method comprises a buried bit line with a covering insulation layer above it are formed in particular in a trench with a trench insulation layer, with both partial regions of the covering insulation layer being removed and a multiplicity of covering connection layers being formed therein using just one mask after the doping regions have been formed, which covering connecting layers then electrically connect the buried bit line to the second doping regions via a multiplicity of self-aligning closure layers. In this way, the area-optimized bit line structure can be formed very simply and in a substantially self-aligning fashion.

The covering insulation layer preferably comprises a second covering partial layer which has been formed by means of a TEOS deposition process and is removed again in part or on a half side and is formed directly connected to the substrate by the covering connecting layer. In this way, using suitably doped semiconductor materials, it is possible both to insulate and make contact with the substrate of the buried bit line.

Alternatively, the covering insulation layer may also have a covering sacrificial layer which is formed by means of a spacer process and is removed partially or on a half side by means of a selective etching process, with the result that greatly improved shielding properties in the form of active shielding by the buried bit line are obtained in the trench combined with a further reduced demand for space.

Further aspects and advantages of the invention are discussed below in conjunction with the preferred embodiments.

BRIEF DESCRIPTION OF THE DRAWINGS

FIGS. 5A-5I show simplified sectional views illustrating important method steps involved in the fabrication of a bit line structure in accordance with the first exemplary embodiment.

FIGS. 6A-6F2 show simplified sectional views illustrating important method steps involved in the fabrication of a bit line structure in accordance with a second or third exemplary embodiment.

DETAILED DESCRIPTION OF THE DRAWINGS AND PRESENTLY PREFERRED EMBODIMENTS

Figure 2:
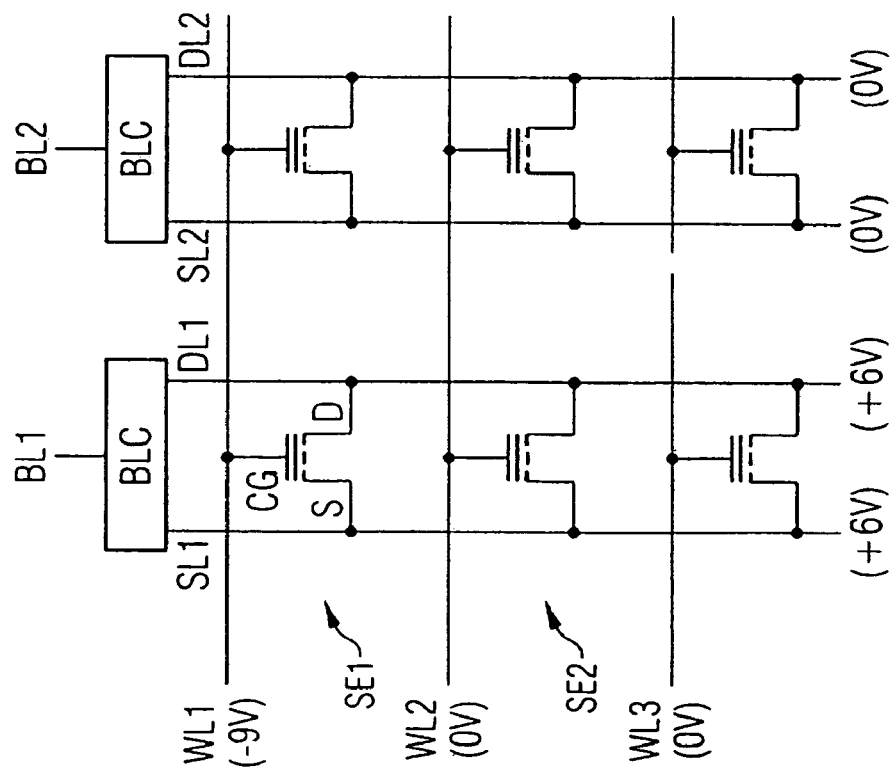
FIG. 2 shows a simplified plan view of a layout in accordance with FIG. 1 with a conventional bit line structure.
Figure 3:
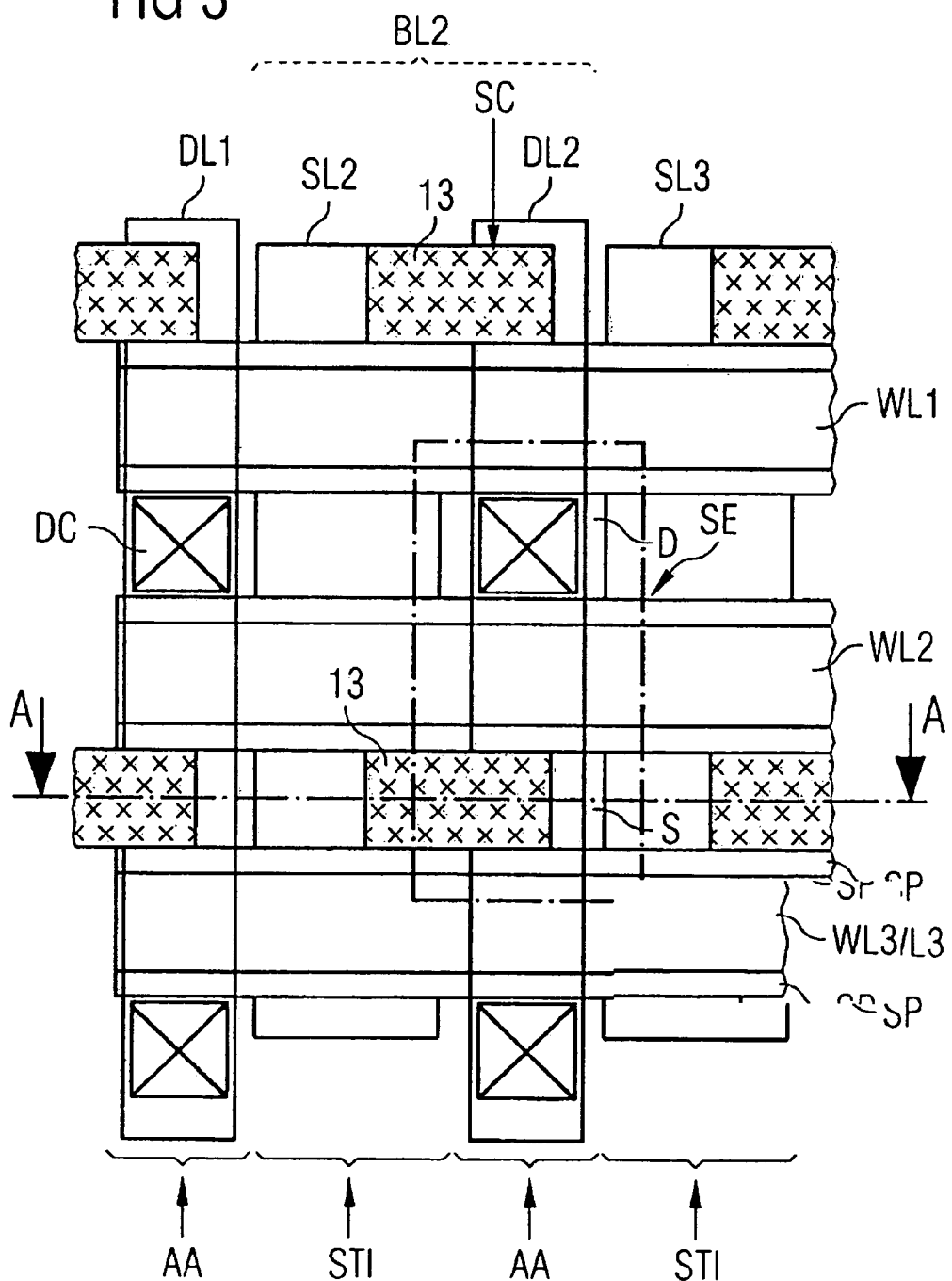
FIG. 3 shows a simplified plan view of a layout of a semiconductor circuit with a bit line structure according to one embodiment.

FIG. 3 shows a simplified plan view illustrating a bit line structure according to one embodiment as can be used, for example, in an SNOR semiconductor memory circuit. Identical reference symbols in this figure denote identical or corresponding elements or layers to those shown in FIGS. 1 and 2. In accordance with FIG. 3, a multiplicity of active areas AA in strip form are formed in columns in a substrate which, by way of example, includes a semiconductor substrate and preferably silicon, by means of a multiplicity of trench isolations STI in strip form. As in the prior art shown in FIG. 2, word line stacks WLx, where x=1 to n, are formed in lines perpendicular to these active areas AA in strip form at the surface of the substrate. These word line stacks, are formed in order to produce, for example, nonvolatile memory elements, having a first insulation layer, such as for example a gate oxide layer or tunneling layer, a charge-storing layer, such as for example a floating gate, a second insulation layer, such as for example an intermediate dielectric, and a control layer as the actual driving word line. For insulation purposes, side wall insulation layers or spacers SP are formed at the side walls of the word line stacks WLx. Accordingly, a switching element or a nonvolatile memory element SE, which in order to realize a field-effect transistor structure has drain regions D and source regions S as first and second doping regions at the sides of the word line stacks, is formed at each crossover point or overlap point between the active areas AA and the word line stacks WLx.

However, to realize the area-optimized semiconductor circuit according to the disclosed embodiments, the bit line structure comprising a source line and drain line pair SLx and DLx where x=1 to m is formed not only at the surface of the substrate but also on the one hand as a buried bit line SLx in the trench isolation STI within the substrate and on the other hand as a surface bit line DLx at or above the substrate surface. More specifically, the buried bit line SLx is embedded in the lower layers of the trench isolation STI and is connected to the source regions S with which contact is to be made via locally formed self-aligning terminal layers 13. On the other hand, the surface bit line DLx, which is formed, for example, in a first metallization level, is connected to associated drain regions D of the switching elements SE via contacts DC. This results in a bit line structure which is optimized with regard to the space required and in which in particular the pitch dimensions (feature size+ feature spacing) can be significantly reduced.

In accordance with FIG. 3, the surface bit line DLx is formed in strip form above the active areas AA. On account of this rectilinear strip design, they can be defined lithographically in a relatively simple way. This will become particularly important in future. However, it may also take any other form in the same way.

Figure 4:
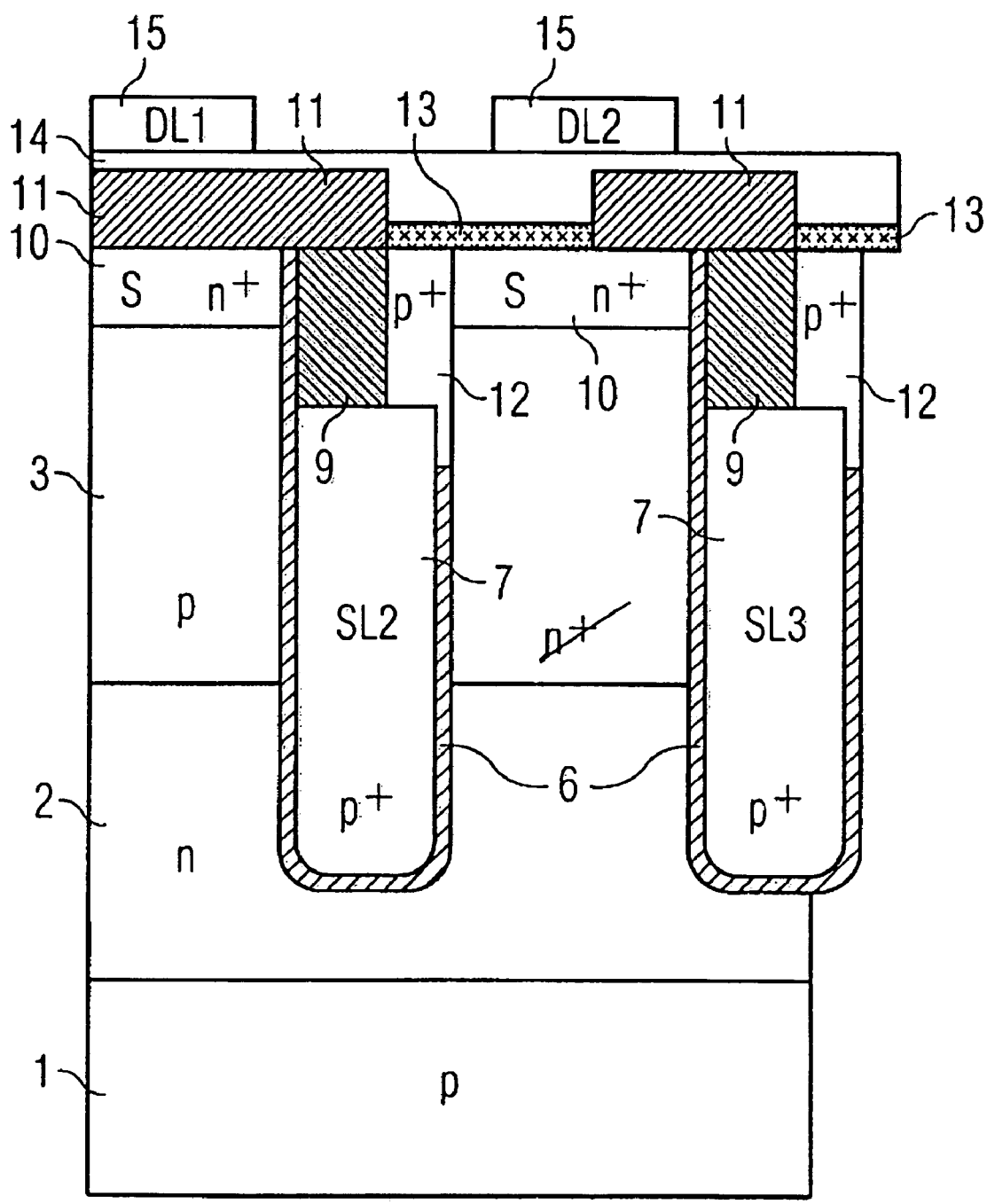
FIG. 4 shows a simplified sectional view of the semiconductor circuit arrangement shown in FIG. 3 for the purpose of illustrating a bit line structure in accordance with a first exemplary embodiment.

FIG. 4 shows a simplified sectional view corresponding to Section A-A shown in FIG. 3; identical reference symbols once again denote identical elements or layers and their description will not be repeated below.

In accordance with FIG. 4, a semiconductor substrate a has a multilayer structure or a multiple well structure, in which a first, for example p-type well 3 and a second, for example n-type well 2 are formed in an actual semiconductor substrate 1 or a deep p-type well 1. A multiple well structure of this type is advantageous in particular with regard to its shielding action and its insulation properties, since sufficient insulation layers can be formed even in deep regions of the substrate, for example by means of space charge regions, and furthermore complex structures can be realized.

Then, deep trenches, which at their trench walls have a trench insulation layer 6, have been formed in the semiconductor substrate or in the associated layers or wells 1, 2, 3. Then, the actual buried bit line SLx has been formed in a lower region of the trenches with their trench insulation layer 6 by means of an electrically conductive filling layer 7; a covering insulation layer having preferably one second covering partial layer 9 has been formed in an upper partial region of the trench or at a half side, this covering insulation layer preferably being formed by means of a STI (Shallow Trench Isolation) method. In this way, in accordance with FIG. 4, excellent insulation properties, in particular in an upper region of the trench, are formed toward the left-hand half side.

In the further upper partial region of the trench or at the right-hand half side, the insulation layer 9 and the trench insulation layer 6 at associated second doping regions 10 or source regions S have been completely removed and replaced by a multiplicity of terminal connecting layers 12, which in turn are electrically conductive and make contact with the buried bit line or filling layer 7. The second doping regions 10 have been formed at the substrate surface between the insulation trenches and preferably directly adjoin the trenches. Then, to connect these second doping regions 10 to the buried. Bit line SLx, self-aligning terminal layers 13 have been formed between a mask layer 11 in the region of the substrate surface and, in accordance with FIG. 4, directly at the surface of the substrate. These self-aligning terminal layers 13, in the case of silicon semiconductor material, consist of silicide or salicides (self-aligned suicides).

To insulate the substrate, the second doping regions 10 and the terminal layers 13 from the layers above, an intermediate insulation layer 14 has also been formed, at the surface of which, finally, the structured surface bit lines DLx have been formed in strip form as structured electrically conductive layers 15.

This for the first time results in an area-optimized bit line structure even for SNOR architectures which in particular has low demands with regard to the pitch (feature size+ feature spacing) in metallization levels.

In accordance with FIG. 4, a semiconductor material (e.g. Si) of the opposite conduction type p+ to the second doping region 10 is used as buried bit line or electrical filling layer 7 and as covering connecting layer 12. More specifically, by way of example, a p+-doped semiconductor material is used for the filling layer 7 and the covering connecting layer 12, whereas the source region S is n+-doped and is located in the p-doped well 3. With an arrangement of this nature, in which in particular the multiplicity of connecting layers 12, on account of the absence of the trench insulation layer 6 in the upper partial region of the trench, are in direct contact with the substrate or the p-type well 3, not only can contact be made with the source region S by means of the buried bit line, but so too can the p-type well 3, with the result that, in particular in the case of nonvolatile memory elements, such as for example flash EPROM elements, a more homogenous tunneling behavior and an increased number of write/erase cycles (endurance) can be achieved. Furthermore, parasitic diodes or leakage currents can be significantly reduced as a result. A further benefit of making direct contact with the substrate or a well of the substrate via the connecting layer 12 in this way is the fact that there is no need for surface contacts, which would usually be required in order to realize a uniform potential in a well of this nature. Accordingly, in this way demands imposed on the layout can be significantly relaxed.

FIGS. 5A-5I show simplified sectional views illustrating important method steps involved in the fabrication of a bit line structure as shown in FIG. 4; identical reference symbols once again denote identical or corresponding elements or layers, and these elements or layers will not be described once again in the text which follows.

Figure 5A:
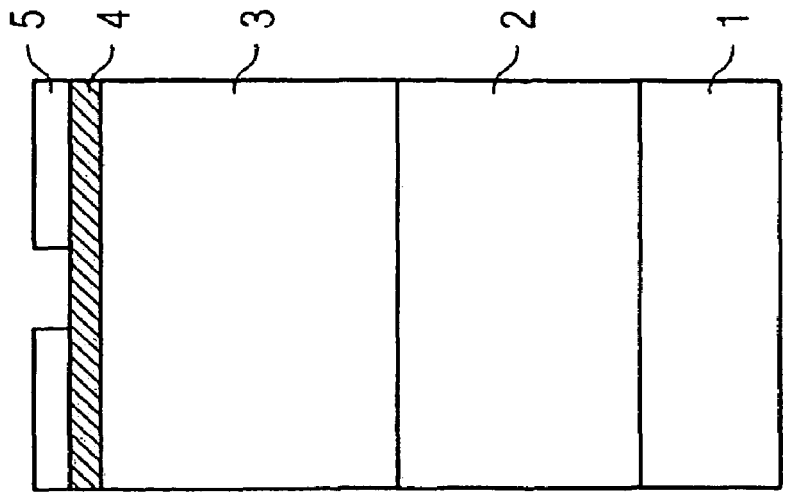

Accordingly, as shown in FIG. 5A, a multiplicity of wells are formed in a substrate, for example by means of ion implantation, forming, for example, a deep p-type well 1, a shallow first well 3 and a second n-type well 2. Of course, the deep well 1 may also simply be the substrate itself or alternatively it is possible for an even greater number of wells to be formed in the substrate. Then, a first auxiliary insulation layer 4 is formed at the surface of the semiconductor material, for example by deposition or growth of an oxide layer. This is followed by forming and patterning a hard mask layer 5, with silicon nitride preferably being formed at the surface of the first auxiliary insulation layer 4. The hard mask layer 5 is patterned using conventional photolithographic methods and is substantially used to define the trenches which are to be formed.

Figure 5B:
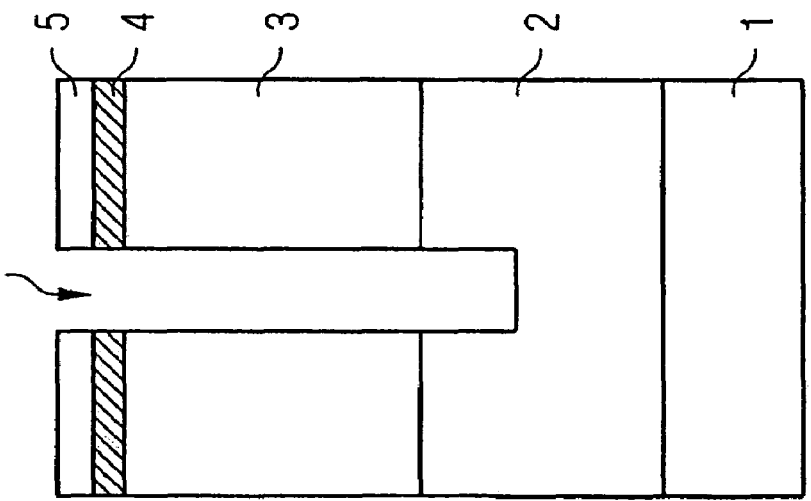

Then, in accordance with FIG. 5B, a deep trench T is formed in the substrate by means of the patterned hard mask 5; in accordance with the exemplary embodiment described, this trench extends down into the second well 2. In this context, it is preferable to use an anisotropic etching process, such as for example reactive ion etching (RIE). This etching step is concluded, for example, by a cleaning step in which polymers or polymer residues are removed.

Figure 5C:
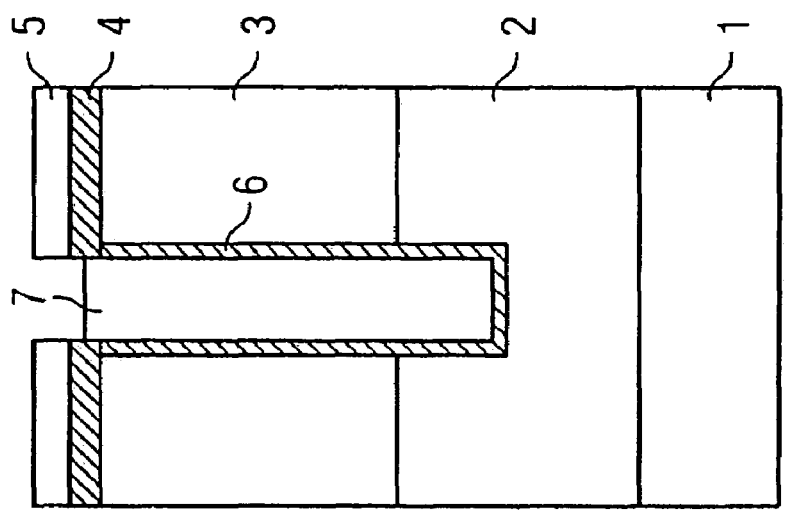

Then, in accordance with FIG. 5C, a trench insulation layer 6 is formed over the entire trench surface of the trench T, a thermal oxidation preferably being carried out in order to form what is known as a liner oxide. In principle, however, it is also possible to use other insulation layers instead of the silicon dioxide as trench insulation layers 6; in particular, it is also possible to realize insulating multiple layers.

Then, to produce the buried bit line, an electrically conductive filling layer 7 is formed in the trench T or at the surface of the trench insulation layer 6. In this case, it is preferable to deposit highly doped polysilicon in the trench, the doping being selected as a function of the first well 3 used and the intended contact which is to be made. However, in principle it is also possible for other electrically conductive layers, such as for example metals, to be formed in the trench as buried bit line SLx.

Figure 5D:
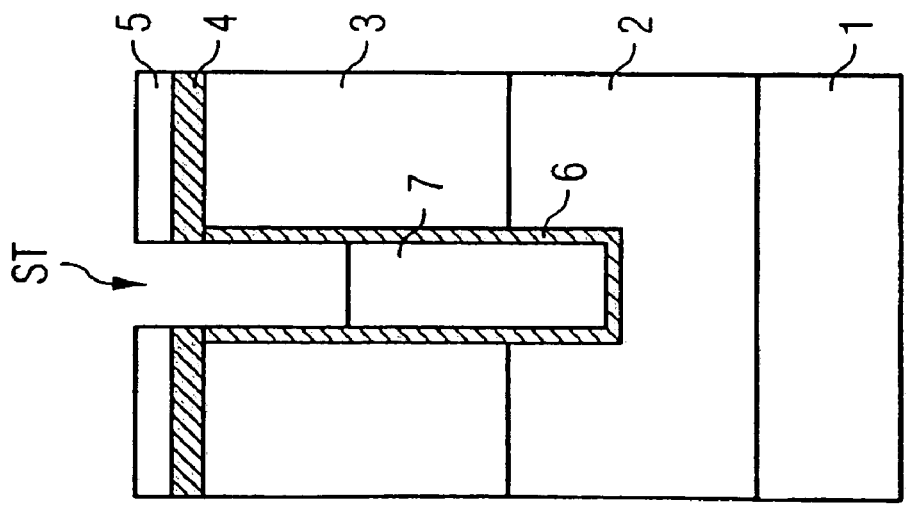

In accordance with FIG. 5D, in a subsequent step first of all the electrically conductive filling layer 7 is recessed; by way of example, an STI process can be used to realize shallow trench isolations and to form shallow trenches ST. The individual method steps involved in a conventional STI process of this type will not be dealt with in more detail, since they are generally known to the person skilled in the art.

Figure 5E:
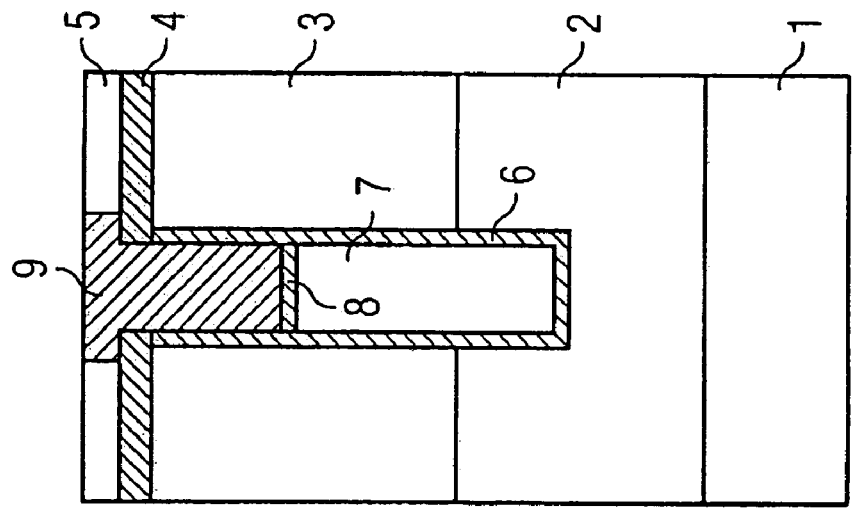

In accordance with FIG. 5E, in this case, following a preferably anisotropic etching step, it is also possible for the trench edges of the hard mask layer 5 to be etched back, which is known as a "nitride pullback". This to a certain extent relieves the stresses at the trench edges for further processing and also results in improved electrical properties of, for example, CMOS transistors which are likewise present in the semiconductor circuit.

Then, it is also possible to form a first covering partial layer 8 as insulation layer at the surface of the filling layer 7 which has been etched back; in this case it is once again preferable to carry out a thermal oxidation to form a further liner oxide. Finally, a second covering partial layer 9 is formed as a further insulation layer, the upper region of the trench preferably being completely filled with silicon dioxide by means of a TEOS deposition process. After a planarizing step, such as for example a CMP (Chemical Mechanical Polishing) process, in which the hard mask layer 5 is used as a stop layer, the sectional view illustrated in FIG. 5E is obtained.

Figure 5F:
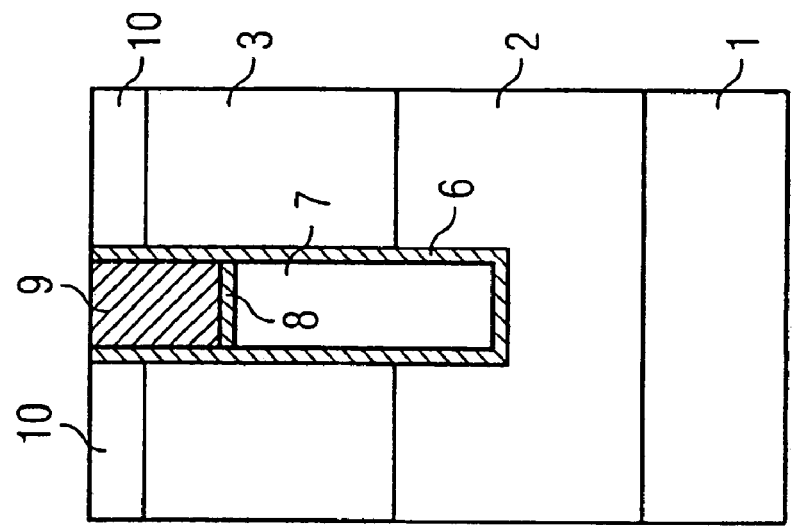

Then, in accordance with FIG. 5F, the hard mask layer 5 or the silicon nitride is completely removed and optionally so too is the first auxiliary insulation layer 4. At this point in time, by way of example, a first insulation layer (not shown) or gate oxide layer or tunneling oxide layer is formed at the respective regions of the active area AA at the semiconductor substrate. However, a first insulation layer of this type is not required in the region of the sectional illustration, and consequently it is eliminated and only the first doping regions (not shown) and second doping regions (shown) 10 are then formed as source and drain regions at the surface of the semiconductor substrate. These doping regions 10 are formed, for example, by means of conventional implantation methods; it is also possible to carry out LDD or terminal implantations using respective spacers.

Then, in accordance with FIG. 5G, a mask layer 11 or cap layer 11 is formed and is patterned in such a manner that in each case only a partial region, e.g. a half side, of the trench is covered. To realize this mask layer 11, by way of example silicon dioxide or silicon nitride is deposited and patterned, although it is also possible to use other materials, such as for example new types of metal oxides ($ZrO_2$, $Al_2O_3$, . . . )

Then, in accordance with FIG. 5H, the uncovered partial region of the covering insulation layer, comprising the trench insulation layer 6 and the first and second covering partial layers 8 and 9, is completely removed using the mask layer 11 and by carrying out a, for example, strongly selective anisotropic oxide etching process, until the filling layer 7 is uncovered. This may also lead to an overetch (not shown) or further removal of the trench insulation layer 6 (cf. FIG. 4).

Then, in accordance with FIG. 5I, the covering connecting layer 12 or, as seen over the entire trench, a multiplicity of covering connecting layers is formed at the corresponding locations in the etched-back partial regions of the trench; this preferably involves deposition of in situ-doped polysilicon.

After this formation of the covering connecting layer 12 which is electrically conductively connected to the filling layer 7, the first and second doping regions 10 in the substrate are additionally etched back, which ensures that there are no parasitic short circuits between adjacent source regions as a result of residues of covering connecting layer 12. Then, a multiplicity of self-aligning terminal layers 13 are formed at the surface of the covering connecting layer 12 and of the doping regions 10, resulting in an electrical connection between doping regions 10 and covering connecting layer 12 or the buried bit lines. To produce highly conductive terminal regions 13 of this type, by way of example, first silicidable material or a silicidable metal layer, such as for example cobalt, nickel or platinum, is deposited over the entire surface. Then, the surface layer of the semiconductor material, the covering connecting layer 12 and the doping regions 10 are transformed using the silicidable material to form the highly conductive terminal regions 13, without any silicide being formed at those surfaces which are not in contact with semiconductor material (silicon), i.e. at the mask layer 11, but rather at these surfaces the material which has been deposited (metal) remaining in place, which means that, in turn, the metal layer which has been deposited—but not silicided—can be etched back selectively by means of a preferably wet-chemical etching process. In this way, both the self-aligning formation of the covering connecting layer 12 and of the terminal layers 13 can be carried out by means of a single mask or mask layer 11; furthermore, if suitable doping materials are selected, direct contact can be made with the first well 3.

In the further steps (not illustrated), by way of example, the mask layer 11 can be removed again and the intermediate insulation layer 14 illustrated in FIG. 4 and the metallization layer 15 can be formed and patterned in order to realize the surface bit lines DLx. Finally, a multiplicity of contacts (DC) for electrically connecting the surface bit line (DLx) to the first doping regions (B) is formed.

Figure 1:
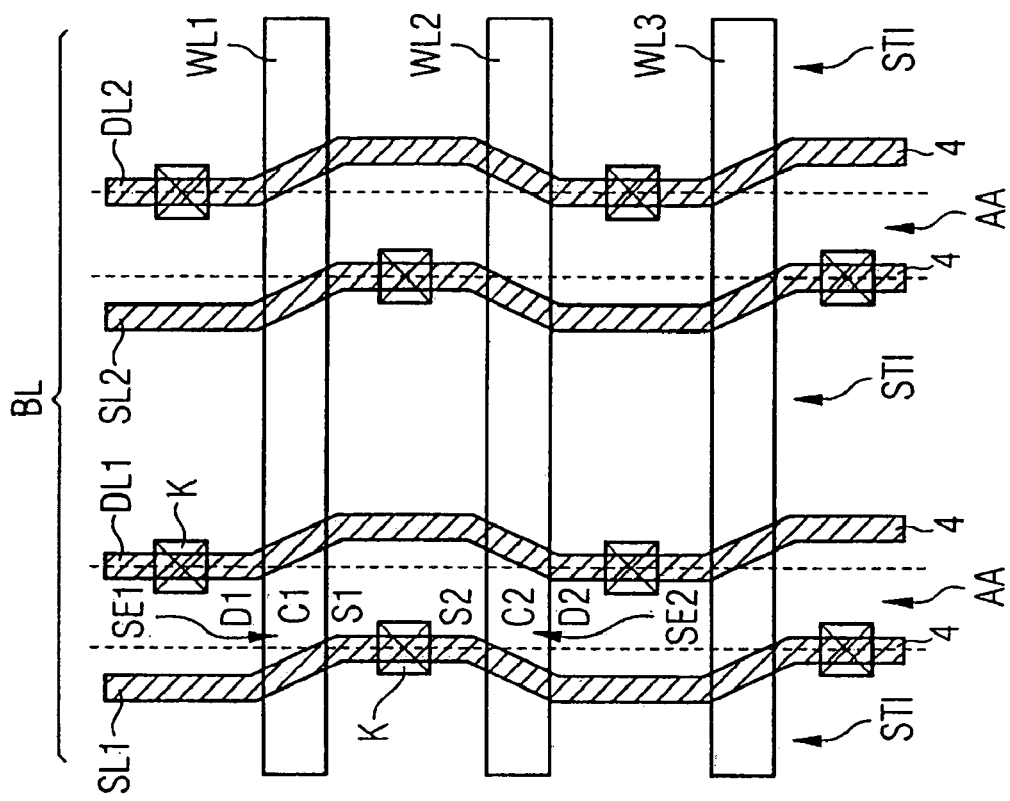
FIG. 1 shows a simplified equivalent circuit diagram of an SNOR architecture.

FIGS. 6A to 6F2 show simplified sectional views illustrating important method steps involved in the fabrication of a bit line structure in accordance with a second or third exemplary embodiment; identical reference symbols denote identical or corresponding layers to those shown in FIGS. 1 to 5, and consequently these layers will not be described again in the text which follows.

Similarly, as described above, preparatory steps are carried out for the purpose of forming in particular the trench T, the trench insulation layer 6 and the etched-back filling layer 7, in accordance with FIGS. 5A to 5D, for which reason specific reference is made at this point to the corresponding description.

In accordance with FIG. 6A, after a method step as shown, for example, in FIG. 5D, the upper trench region is then not completely filled with the first and second covering partial layers 8 and 9, but rather first of all a covering sacrificial layer 8A is formed at the surface of the trench insulation layer 6 in the upper trench region, for example by means of a spacer method. The covering sacrificial layer 8A should in this case have an etching selectivity which is different than the trench insulation layer 6 and an insulation filling layer 9 which is subsequently to be formed. A spacer method of this type (formation of a conformal layer+anisotropic etchback) will not be described below, since it is generally known to the person skilled in the art.

Then, in accordance with FIG. 6B, in a similar way to the method step shown in FIG. 5E, a second covering partial layer 9 for completely filling the trench is formed by means of, for example, a TEOS deposition process, and then a planarization process (CMP) is carried out and the hard mask layer 5 is removed.

Then, in accordance with FIG. 6C, a mask layer 11 is formed and patterned at the surface of the substrate in such a manner that at least a partial region of the trench is covered by the mask layer 11, which preferably involves covering half of the trench or of the trench insulation located in the upper trench.

Then, in accordance with FIG. 6D, according to a second exemplary embodiment a highly selective isotropic etching process can be carried out for the purpose of removing the covering sacrificial layer 8A; by way of example, if a silicon nitride layer is used as covering sacrificial layer 8A, phosphoric acid can be used as etchant. However, a drawback of this is that, by way of example, silicon layers cannot be used for the mask layer 11, but instead insulation layers, such as for example Al2O3, ZrO2, HfO2, etc. (metal oxides) are suitable for use as mask layer 11.

This results in a contact hole leading to the filling layer 7, which is completely insulated with respect to the substrate or the first well 3 by the trench insulation layer 6, with the result that improved insulation properties are obtained for certain applications and the cell surface area is reduced, since in this case, on account of the self-alignment, there is no need to plan in any photographic technology reserve for typical misalignments.

Accordingly, in this second exemplary embodiment shown in FIG. 6E1, the trench insulation layer 6 is retained even in the upper uncovered or unmasked region, with the result that, during thinning or recessing of the doping regions 10 which is subsequently carried out, there is less risk of over-etching occurring.

Then, in accordance with FIG. 6F1, the covering connecting layer 12 is once again formed, as in FIG. 5I, the doping region 10 is (optionally) recessed and the highly conductive terminal layer 13 is formed in a self-aligning fashion. This results in a buried bit line structure in which the buried bit line is not in contact with the substrate or the first well 3 and consequently there is a higher degree of flexibility with regard to the terminal potentials.

In accordance with FIG. 6E2 or a third exemplary embodiment, however, it is also in turn possible for the trench insulation layer 6 to be completely removed from the uncovered upper region of the trench in a further, preferably wet-chemical etching process using the mask layer 11, which in turn results in direct contact being made with the substrate or the first well 3, given suitable doping of the semiconductor materials used.

FIG. 6F2 shows the final steps for forming the covering connecting layer 12 and the highly conductive terminal layer 13, in which context reference is made once again to the description given in connection with FIG. 5I.

Figure 7:
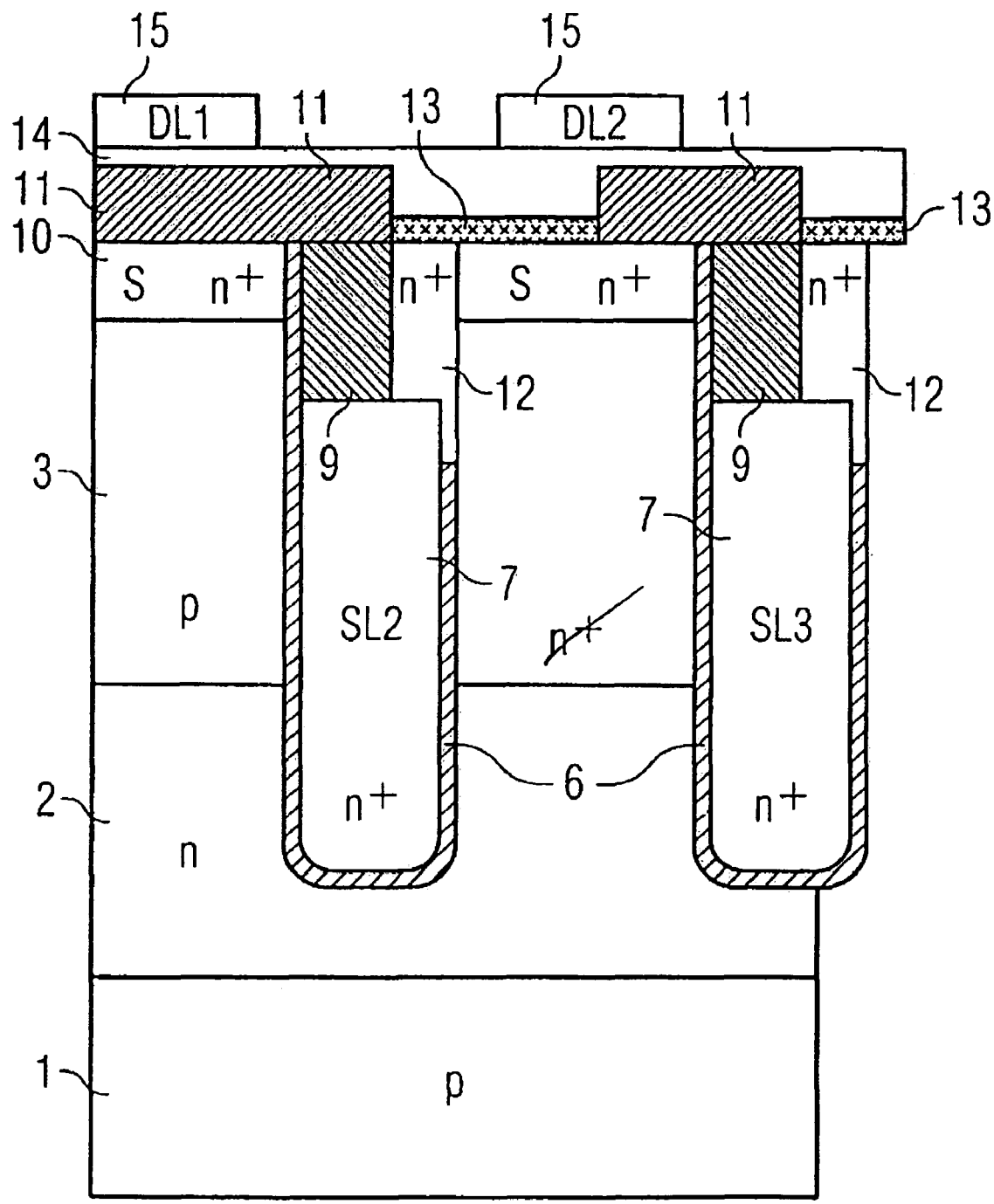
FIG. 7 shows a simplified sectional view illustrating a bit line structure in accordance with a fourth exemplary embodiment.

FIG. 7 shows a simplified sectional view of a bit line structure in accordance with a fourth exemplary embodiment; identical reference symbols once again denote identical or corresponding layers in particular to those shown in FIG. 4, and these layers will not be described again below.

FIG. 7 substantially corresponds to the structure shown in FIG. 4, except that to realize the filling layer 7 and the covering connecting layer 12, a semiconductor material which has the same conduction type as the doping region 10 is now used. More specifically, by way of example, in situ-doped n+-polysilicon, which can already form an electrically conductive contact with the n+-doped source region S, is used as filling layer 7 and covering connecting layer 12. However, since the covering connecting layer 12 and the substrate or the first well 3 now have a doping of the opposite conduction type, what are known as depletion or space charge regions, which effect an insulating action in a similar way to the trench insulation layer 6 in the second exemplary embodiment shown in FIG. 6F1, are formed at the contact surfaces between the covering connecting layer 12 and the substrate or first well 3. In this way, a well insulation between the buried bit line and the substrate or an associated well is obtained even when using the method steps shown in FIG. 5 and the second alternative in FIG. 6.

Furthermore, in this context it should be pointed out that the highly conductive connecting layers 13 do not have to be formed inside the substrate, i.e. recessed into the doping regions 10, but rather may be formed partially or completely at the surface of the substrate in the same way.

The disclosed embodiments have been described above on the basis of a nonvolatile SNOR semiconductor memory circuit. However, it is not restricted to this particular application and rather in the same way comprises further semiconductor memory circuits which have a corresponding bit line structure. Furthermore, the invention is not restricted to the silicon semiconductor substrates and materials described, but rather in the same way encompasses alternative semiconductor materials with corresponding dopings or insulation features.

LIST OF REFERENCE SYMBOLS 1, 2, 3 Substrate or corresponding wells
4 First auxiliary insulation layer
5 Hard mask layer
6 Trench insulation layer
7 Filling layer
8 First covering partial layer
9 Second covering partial layer
8A Covering sacrificial layer
10 Doping region
11 Mask layer
12 Covering connecting layer
13 Terminal layer
14 Intermediate insulation layer
15 Metallization layer
T Trench
SLX Buried bit line
DLx Surface bit line
BLx Bit line pair
WLx Word line
SE Switching element
K, DC DC Contact
STI Shallow trench isolation
AA Active area
S Source regions
D Drain regions It is therefore intended that the foregoing detailed description be regarded as illustrative than limiting, and that it be understood that it is the following claims, including all equivalents, that are intended to define the spirit and scope of this invention.

We claim:
1. A bit line structure having:
a surface bit line, which, for connection of a multiplicity of first doping regions, is formed above a substrate surface; and
a buried bit line which, for connection of a multiplicity of second doping regions, is formed inside a substrate, in such a manner that a trench is formed in the substrate;
a trench insulation layer at a trench surface of the trench;
the buried bit line in a lower region of the trench on the trench insulation layer;
a covering insulation layer on the buried bit line in a first, upper partial region of the trench;

a multiplicity of covering connecting layers on the buried bit line in a second upper partial region of the trench; and a multiplicity of self-aligning terminal layers in the region of the substrate surface are formed, the multiplicity of covering connecting layers being electrically connected via the terminal layers to the multiplicity of second doping regions.

2. The bit line structure as claimed in patent claim 1, wherein the covering insulation layer forms a shallow trench isolation.

3. The bit line structure as claimed in patent claim 2, wherein the substrate includes crystalline silicon, the multiplicity of covering connecting layers include highly doped polysilicon and the multiplicity of self-aligning terminal layers include a silicide.

4. The bit line structure as claimed in one of patent claim 2, wherein the multiplicity of covering connecting layers are also in direct contact with the substrate.

5. The bit line structure as claimed in one of patent claim 2, wherein the multiplicity of covering connecting layers have a conduction type which is the same as the conduction type of the second doping regions.

6. The bit line structure as claimed in one of patent claim 2, wherein the multiplicity of covering connecting layers have an opposite conduction type from the conduction type of the second doping regions.

7. The bit line structure as claimed in one of patent claim 2, wherein the substrate has a multiple well structure.

8. The bit line structure as claimed in one of patent claim 2, wherein the first doping regions form drain regions and the second doping regions form source regions of a non-volatile SNOR memory circuit which, as word line stack includes a first insulation layer, a charge-storing layer, a second insulation layer and a control layer.

9. The bit line structure as claimed in patent claim 1, wherein the substrate includes crystalline silicon, the multiplicity of covering connecting layers include highly doped polysilicon and the multiplicity of self-aligning terminal layers include a silicide.

10. The bit line structure as claimed in one of patent claim 9, wherein the multiplicity of covering connecting layers are also in direct contact with the substrate.

11. The bit line structure as claimed in one of patent claim 9, wherein the multiplicity of covering connecting layers have a conduction type which is the same as the conduction type of the second doping regions.

12. The bit line structure as claimed in one of patent claim 9, wherein the multiplicity of covering connecting layers have an opposite conduction type from the conduction type of the second doping regions.

13. The bit line structure as claimed in one of patent claim 9, wherein the substrate has a multiple well structure.

14. The bit line structure as claimed in one of patent claim 9, wherein the first doping regions form drain regions and the second doping regions form source regions of a non-volatile SNOR memory circuit which, as word line stack includes a first insulation layer, a charge-storing layer, a second insulation layer and a control layer.

15. The bit line structure as claimed in one of patent claim 1, wherein the multiplicity of covering connecting layers are also in direct contact with the substrate.

16. The bit line structure as claimed in one of patent claim 15, wherein the multiplicity of covering connecting layers have a conduction type which is the same as the conduction type of the second doping regions.

17. The bit line structure as claimed in one of patent claim 15, wherein the multiplicity of covering connecting layers have an opposite conduction type from the conduction type of the second doping regions.

18. The bit line structure as claimed in one of patent claim 15, wherein the substrate has a multiple well structure.

19. The bit line structure as claimed in one of patent claim 15, wherein the first doping regions form drain regions and the second doping regions form source regions of a non-volatile SNOR memory circuit which, as word line stack includes a first insulation layer, a charge-storing layer, a second insulation layer and a control layer.

20. The bit line structure as claimed in one of patent claim 1, wherein the multiplicity of covering connecting layers have a conduction type which is the same as the conduction type of the second doping regions.

21. The bit line structure as claimed in one of patent claim 20, wherein the substrate has a multiple well structure.

22. The bit line structure as claimed in one of patent claim 20, wherein the first doping regions form drain regions and the second doping regions form source regions of a non-volatile SNOR memory circuit which, as word line stack includes a first insulation layer, a charge-storing layer, a second insulation layer and a control layer.

23. The bit line structure as claimed in one of patent claim 1, wherein the multiplicity of covering connecting layers have an opposite conduction type from the conduction type of the second doping regions.

24. The bit line structure as claimed in one of patent claim 23, wherein the substrate has a multiple well structure.

25. The bit line structure as claimed in one of patent claim 23, wherein the first doping regions form drain regions and the second doping regions form source regions of a non-volatile SNOR memory circuit which, as word line stack includes a first insulation layer, a charge-storing layer, a second insulation layer and a control layer.

26. The bit line structure as claimed in one of patent claim 1, wherein the substrate has a multiple well structure.

27. The bit line structure as claimed in one of patent claim 26, wherein the first doping regions form drain regions and the second doping regions form source regions of a non-volatile SNOR memory circuit which, as word line stack includes a first insulation layer, a charge-storing layer, a second insulation layer and a control layer.

28. The bit line structure as claimed in one of patent claim 1, wherein the first doping regions form drain regions and the second doping regions form source regions of a non-volatile SNOR memory circuit which, as word line stack includes a first insulation layer, a charge-storing layer, a second insulation layer and a control layer.

* * * * *